United States Patent [19]

Boler et al.

[11] Patent Number: 4,638,187
[45] Date of Patent: Jan. 20, 1987

[54] CMOS OUTPUT BUFFER PROVIDING HIGH DRIVE CURRENT WITH MINIMUM OUTPUT SIGNAL DISTORTION

[75] Inventors: Clifford H. Boler, Bloomington; William W. Leake, St. Paul; Surinder S. Rai, Plymouth; Gene B. Zemske, Minneapolis, all of Minn.

[73] Assignee: VTC Incorporated, Eagan, Minn.

[21] Appl. No.: 782,639

[22] Filed: Oct. 1, 1985

[51] Int. Cl.⁴ ............................................. H03K 21/10
[52] U.S. Cl. .................................... 307/451; 307/443; 307/473; 307/270; 307/579; 307/585
[58] Field of Search ............... 307/473, 451, 443, 579, 307/585, 270, 263, 268

[56] References Cited

U.S. PATENT DOCUMENTS 4,542,310  9/1985  Ellis et al. ............................ 307/579

Primary Examiner—Stanley D. Miller
Assistant Examiner—M. R. Wambach
Attorney, Agent, or Firm—Kinney & Lange

[57] ABSTRACT

A CMOS output buffer provides high drive current without sacrificing speed and with minimum output signal distortion due to internal chip ground bounce or output signal ringing. The output buffer includes a pull-up circuit and a pull-down circuit which distribute switching current spikes over time. The pull-up circuit includes a P-channel FET and an N-channel FET connected in parallel between an output terminal and supply terminal $V_{DD}$, with an inverter connected between the gates of the N-channel and P-channel FETs to provide the proper phase for the P-channel FET as well as delaying turn-on of the P-channel FET with respect to turn-on of the N-channel FET. The pull-down circuit includes a pair of N-channel FETs connected in parallel between the output terminal and ground, and a delay resistance connected between their gates so that turn-on of one of the N-channel FETs is delayed with respect to the other.

32 Claims, 5 Drawing Figures

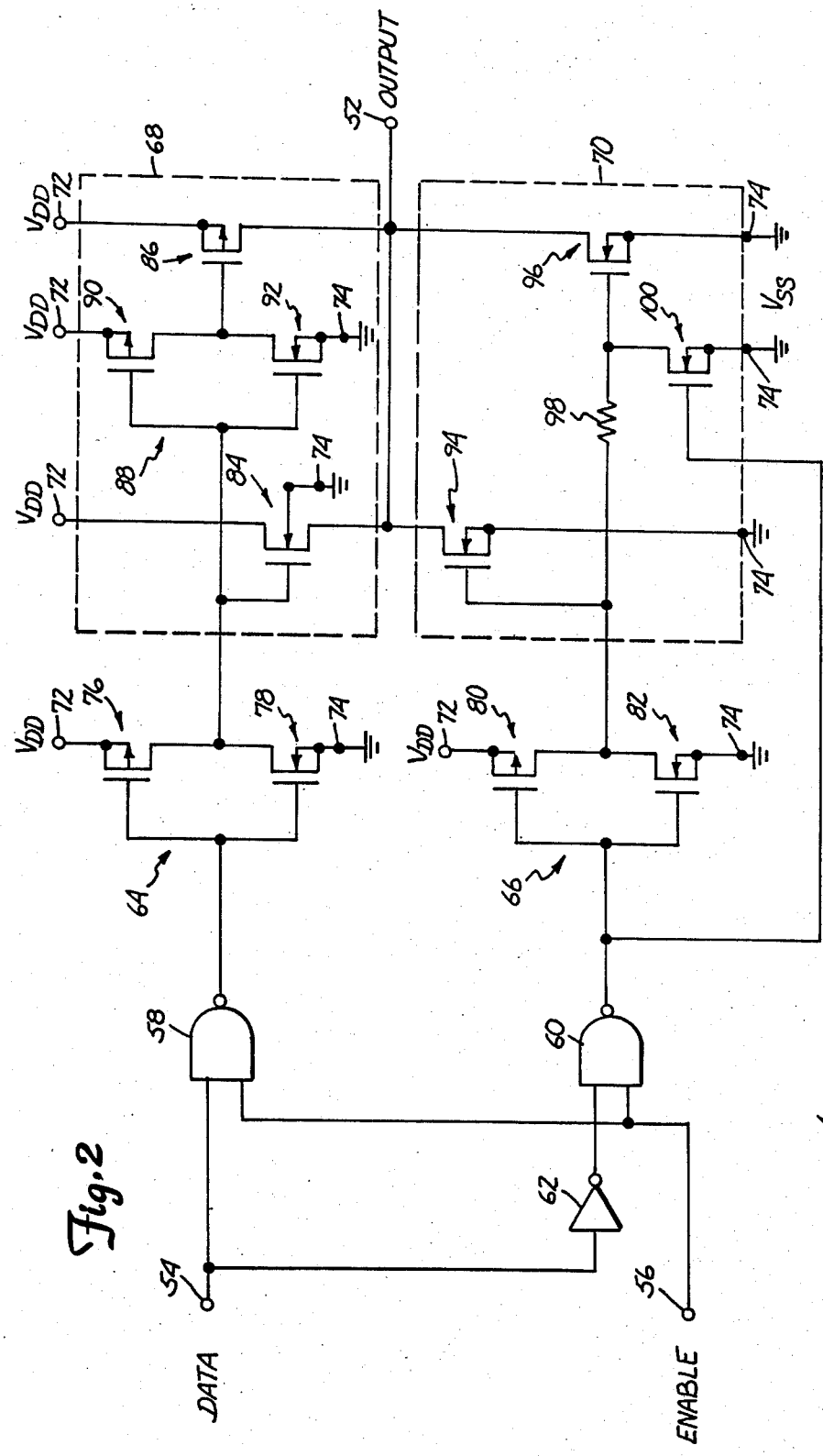

STANDARD OUTPUT BUFFER CURRENT WAVEFORM

DISTRIBUTED OUTPUT BUFFER CURRENT WAVEFORM

CMOS OUTPUT BUFFER PROVIDING HIGH DRIVE CURRENT WITH MINIMUM OUTPUT SIGNAL DISTORTION

BACKGROUND OF THE INVENTION

1. Field of the Invention

The present invention relates to CMOS integrated circuits. In particular, the present invention relates to a CMOS output buffer circuit.

2. Description of the Prior Art

Digital logic, in the form of integrated circuits, has found wide spread use in virtually every type of electronic system. The interface function is a basic function of any electronic system—it allows the logic of one integrated circuit device to interface with other devices. One important component for this interface function is the output buffer which, when enabled, provides an output which is a function of data received from other logic circuitry of the integrated circuit.

CMOS output buffers typically use a P-channel pull-up FET and a N-channel pull-down FET connected to the output terminal. Depending upon the state of the data signal input and an enable signal, either the P-channel FET or the N-channel FET is turned on.

In general, the prior art CMOS output buffers have not been capable of providing output drive current of the magnitude possible with bipolar integrated circuits (for example TTL circuitry). Attempts to achieve higher output drive currents from CMOS output buffers have resulted in sacrifices in speed and output signal distortion due to internal chip ground bounce or output signal ringing.

SUMMARY OF THE INVENTION

The present invention is an improved output buffer which is capable of high drive currents and minimum ground bounce and ringing. This is accomplished by distributing over time the switching current spikes which in prior art output buffers are caused by sudden surges of current when the pull-up and pull-down FETs switch states.

The output buffer of the present invention includes a pull-up circuit which includes first and second FETs connected in parallel between the output terminal and a first supply potential terminal, and first delay means for delaying turn-on of the second FET with respect to turn-on of the first FET. Similarly, the output buffer includes a pull-down circuit having third and fourth FETs connected in parallel between the output terminal and a second supply potential terminal, and second delay means for delaying turn-on of the fourth FET with respect to turn-on of the third FET.

In preferred embodiments of the present invention, the first, third, and fourth FETs are N-channel FETs, and the second FET is a P-channel FET. The first delay means is an inverter connected between the gates of the first and second FETs, and the second delay means is a resistance means connected between the gates of the third and fourth FETs.

To accelerate turn-off of the fourth FET when the pull-down circuit is being turned off, a fifth FET is preferably provided which has its drain-source current path connected to the gate of the fourth FET. The fifth FET turns on, to cause rapid turn-off of the fourth FET, when the pull-down circuit is being turned off.

The output buffer preferably is formed using polysilicon gate FETs, and the resistance means is formed by the polysilicon gates of the third and fourth FETs. This provides self-compensation for variations in widths of the polysilicon gates of the third and fourth FETs due to process variations. As the width of the polysilicon gates narrows under normal process variations, FET current drive increases which tends to cause more ground bounce; but the narrowed width of the polysilicon gates forming the resistance means also causes the resistance to increase. This creates more delay in the switching of the fourth FET with respect to the third FET, which tends to reduce bounce. As the width of the polysilicon gates increases due to process variations, the switching current is reduced, but the resistance of the resistance means is decreased causing less turn-on delay of the fourth FET and hence more switching current.

BRIEF DESCRIPTION OF THE DRAWINGS

FIG. 2 is a schematic diagram of the distributed switching current output buffer of the present invention.

DETAILED DESCRIPTION OF THE PREFERRED EMBODIMENTS

Figure 1:
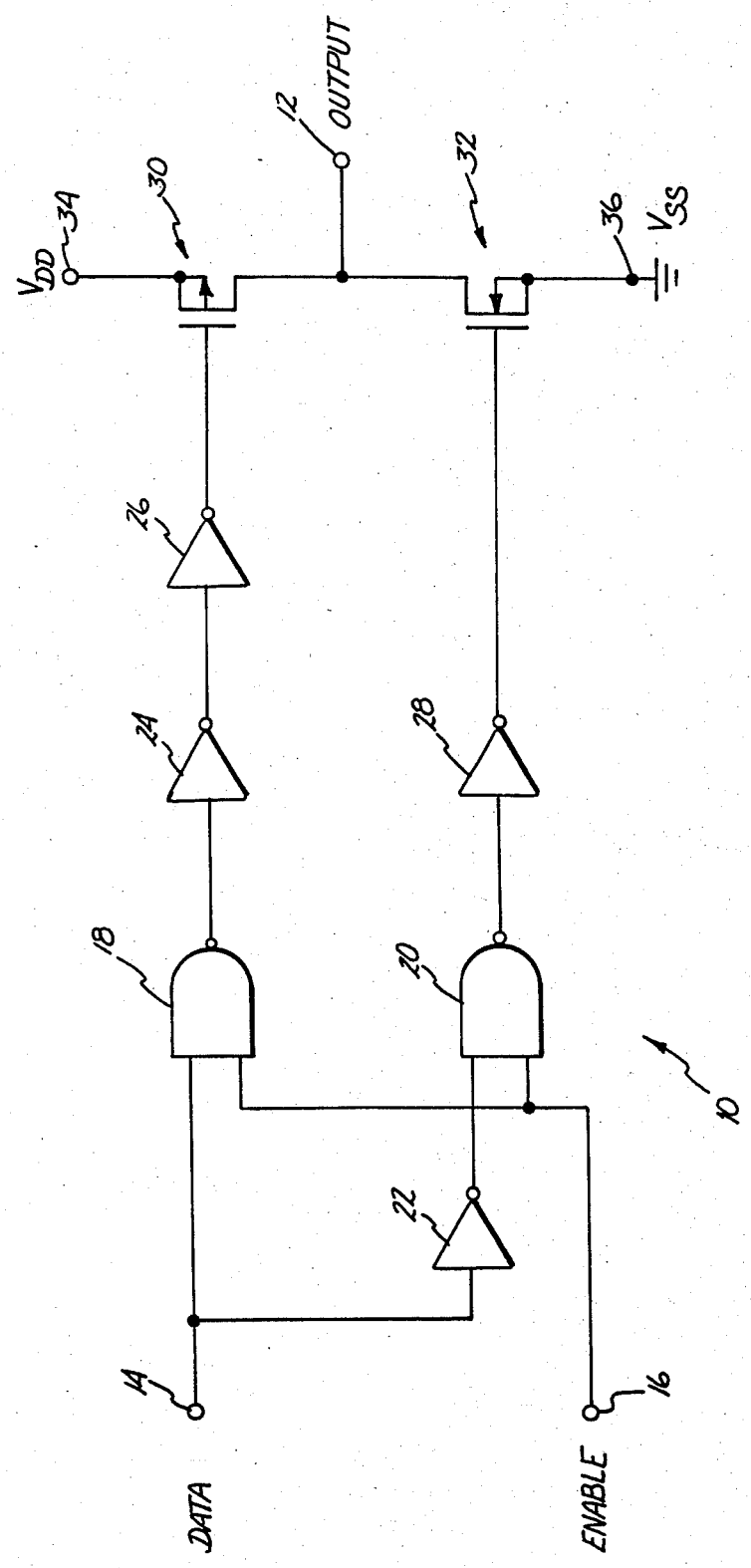
FIG. 1 is a schematic diagram of a prior art CMOS output buffer.

FIG. 1 shows a prior art CMOS output buffer 10 which provides an output signal at output terminal 12 based upon a DATA signal received at data input terminal 14 and an ENABLE signal received at enable input terminal 16. Output buffer 10 includes NAND gates 18 and 20, inverters 22, 24, 26, and 28, an enhancement mode P-channel FET 30, and an enhancement mode N-channel FET 32. Power for all of the components of output buffer 10 is provided by first and second power supply terminals 34 and 36. A first supply potential $V_{DD}$ is supplied at terminal 34, and a second supply potential $V_{SS}$ (or ground) is supplied at second terminal 36.

NAND gate 18 receives the DATA signal and the ENABLE signal at its two input terminals. NAND gate 20, on the other hand, receives the inverted DATA signal from inverter 22 at one input terminal and the ENABLE signal at its other input terminal.

The output of NAND gate 18 is inverted twice by inverters 24 and 26 and is supplied to the gate of P-channel FET 30. The output of NAND gate 20 is inverted by inverter 28 and supplied to the gate of N-channel FET 32.

FETs 30 and 32 act as pull-up and pull-down output drivers, respectively, of output buffer 10. When the ENABLE signal is a high ($V_{DD}$) or logic "1" and the DATA signal is also a "1", the output of NAND gate 18 is "0" and the output of NAND gate 20 is "1". This causes a "0" ($V_{SS}$) to be applied to the gate of P-channel FET 30 and a "0" ($V_{SS}$) to be applied to the gate of N-channel FET 32. As a result, P-channel FET 30 is turned on and N-channel FET 32 is turned off, and the output terminal 12 is pulled up toward supply potential $V_{DD}$.

Conversely, when the ENABLE signal is "1" and the DATA signal is "0", the output of NAND gate 18 is "1" and the output of NAND gate 20 is "0". This causes a "1" to be applied to the gates of FETs 30 and 32, which turns off P-channel FET 30 and turns on N-channel FET 32. As a result, output terminal 12 is pulled down toward supply potential $V_{SS}$.

When the ENABLE signal is "0", the outputs of both NAND gates 18 and 20 are "1", and both FETs 30 and 32 are turned off. This produces a high impedance tri-state mode at output terminal 12 when output buffer 10 is not enabled.

The magnitudes of the drive currents which flow through P-channel FET 30 and N-channel FET 32 are dependent upon the characteristics of the circuitry with which output buffer 10 interfaces. In general, prior art bipolar output buffers have been capable of handling higher drive currents than are possible with the conventional prior art CMOS output buffer shown in FIG. 1. Higher drive currents can be achieved with output buffer 10 only at the expense of a sacrifice in speed and an increase in output signal distortion due to internal chip ground bounce or output signal ringing.

FIG. 2 shows an improved CMOS output buffer 50 which is capable of driving about six to twelve times the output current of the typical prior art CMOS output buffer 10. The present invention achieves this improved performance by distributing over time the switching current spikes which are caused by sudden surges of current that are present when the pull-up and pull-down output drivers switch state.

Output buffer 50 of the present invention provides an output signal at output terminal 52 which is a function of a DATA signal at data input terminal 54 and an enable signal at ENABLE input terminal 56.

In the embodiment shown in FIG. 2, output buffer 50 includes NAND gates 58 and 60, inverters 62, 64, and 66, pull-up circuit 68, and pull-down circuit 70. The power to output buffer 50 is supplied from first and second supply terminals 72 and 74. Voltage $V_{DD}$ is supplied at terminal 72 and voltage $V_{SS}$ (or ground) is supplied at terminal 74.

Inverter 64 is formed by P-channel FET 76 and N-channel FET 78. Fets 76 and 78 (and all other FETs in output buffer 50) are enhancement mode FETs. The gates of FET 76 and 78 are connected to the output of NAND gate 58. The drains of FETs 76 and 78 are connected together to form the output of inverter 64, the source of P-channel FET 76 is connected to terminal 72 and the source of N-channel FET 78 is connected to terminal 74. Inverter 64 inverts the signal from NAND gate 58, and also acts as a buffer between NAND gate 58 and the large output driver FETs of pull-up circuit 68.

Similarly, inverter 66 is formed by P-channel FET 80 and N-channel FET 82. The input of inverter 66, which is formed by the gates of FETs 80 and 82, is connected to the output of NAND gate 60. The drains of FETs 80 and 82 are tied together to form the output of inverter 66, and the sources of FETs 80 and 82 are connected to terminals 72 and 74, respectively. Inverter 66 buffers NAND gate 60 from the large output driver FETs of pull-down circuit 70.

Pull-up circuit 68 includes N-channel FET 84, P-channel FET 86, and inverter 88 (which is formed by P-channel FET 90 and N-channel FET 92).

N-channel FET 84 and P-channel FET 86 have their drain-source current paths connected in parallel between terminal 72 and output terminal 52. The drain of N-channel FET 84 and the source of P-channel FET 86 are connected to first supply terminal 72, and the source of N-channel FET 84 and the drain of P-channel FET 86 are connected to output terminal 52. The gate of N-channel FET 84 is connected directly to the output of inverter 64.

Inverter 88 is also connected to the output of inverter 64 and has its output connected to the gate of P-channel FET 86. The gates of FETs 90 and 92 of inverter 88 are connected together to form the input of inverter 88, and the drains of FETs 90 and 92 are connected together to form the output. The sources of FETs 90 and 92 are connected to terminals 72 and 74, respectively.

Inverter 88 provides the proper phase relationship between FETs 84 and 86 by inverting the output of inverter 64 before applying it to the gate of P-channel FET 86. In addition, inverter 88 provides a delay of the turn-on of P-channel FET 86 with respect to the turn-on of N-channel FET 84.

When the pull-up circuit 68 is to be turned on (i.e. when the DATA and ENABLE signals are both "1") the output of NAND gate 58 is "0". This turns on P-channel FET 76 and turns off N-channel FET 78, so that the output of inverter 64 is "1". This causes N-channel FET 84 to turn on and, after the delay from inverter 88, also causes P-channel FET 86 to turn on.

The pull-up action is started by N-channel FET 84, which provides the bulk of the pull-up drive current. N-channel FET 84 is used to provide more drive than an equivalent size P-channel FET can provide. Since N-channel FET 84 shuts off when the output voltage (and thus the source voltage of FET 84) equals $V_{DD}-1.5$ V, P-channel FET 86 is required to pull output terminal 52 the rest of the way to $V_{DD}$. P-channel FET 86 has its turn-on delayed by inverter 88 and takes over the pull-up requirements when N-channel 84 turns off. The delay provided by inverter 88 distributes the pull-up current and minimizes $V_{DD}$ bounce. In a preferred embodiment, N-channel FET 84 and P-channel FET 86 together provide about 24 mA of DC drive while guaranteeing an output voltage of 2.4 V.

Pull-down circuit 70 includes a pair of output driver N-channel FETs 94 and 96 (which have their drains connected to output terminal 52 and their sources connected to second supply terminal 74), delay resistance 98, and N-channel FET 100.

Pull-down circuit 70 is turned on when the DATA signal at input terminal 54 is "0" and the ENABLE signal is "1". The DATA signal at input terminal 54 is inverted by inverter 62 and applied to one of the two inputs of NAND gate 60. When the DATA signal is "0" and the ENABLE signal is "1", the output of NAND gate 60 is "0", and therefore the output of inverter 66 is "1" (since P-channel FET 80 is turned on and N-channel FET 82 is turned off).

N-channel FET 94 has its gate connected to the output of inverter 66, and is turned on when the output of inverter 66 goes high ("1"). FET 96 has its gate connected through delay resistance 98 to the output of inverter 66, and thus is delayed in its turn-on with respect to the turn-on of FET 94. This distributes the drive current spikes between FETs 94 and 96, and separates the spikes in time by a delay determined by the value of resistance 98. The delayed turn-on of FET 96, therefore, minimizes ground bounce due to lead inductance. When turned on, FETs 94 and 96 together provide (in a preferred embodiment) 48 mA of DC drive with an output voltage of less than 0.5 V at output terminal 52.

N-channel FET 100 has its drain connected to the gate of FET 96 and its source connected to terminal 74. The gate of FET 100 is connected to the output of NAND gate 60. As a result, when the pull-down circuit is to be turned off, FET 100 is turned on because the output of NAND gate 60 goes high ("1"). This pulls the gate of FET 96 down to $V_{SS}$, thus accelerating the turn-off of FET 96 and circumventing the delay which would otherwise be produced by delay resistance 98. This minimizes the amount of current that flows from terminal 72 to terminal 74 during simultaneous switching of pull-up circuit 68 and pull-down circuit 70.

Figure 3A:
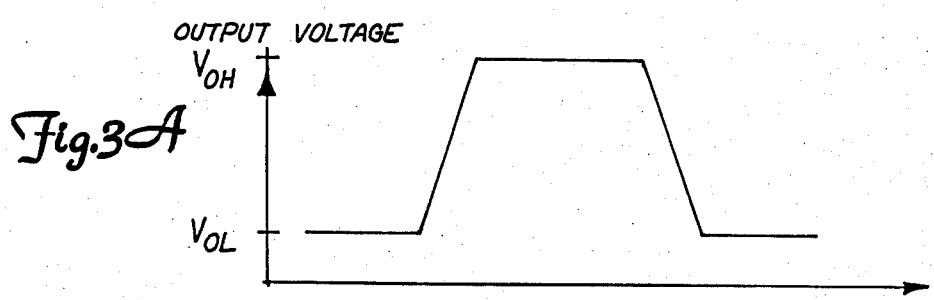
FIGS. 3A–3C show an output voltage waveform; a current waveform for the prior art CMOS output buffer; and a current waveform for the distributed switching current output buffer circuit; respectively.
Figure 3B:
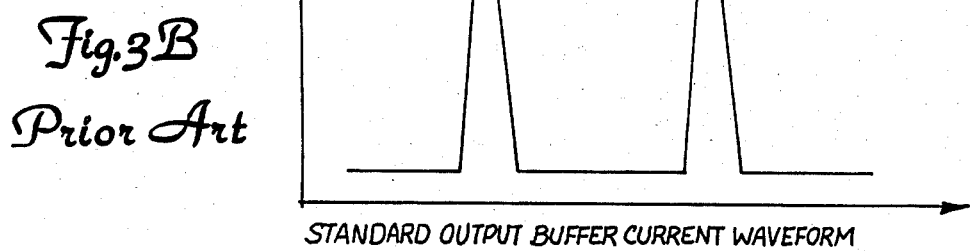
Figure 3C:
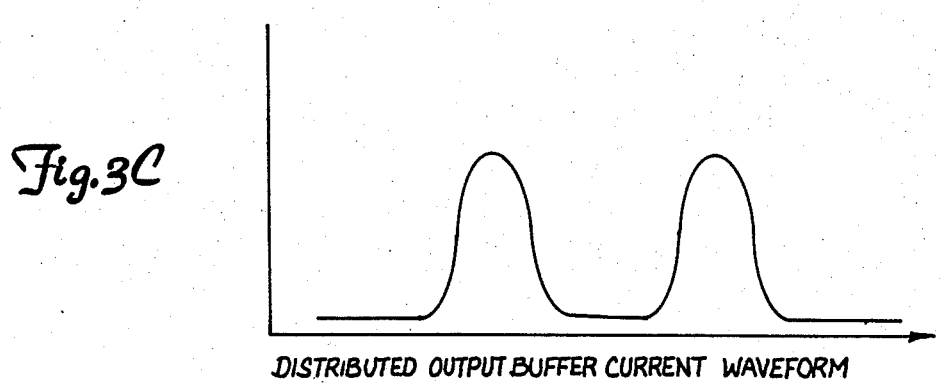

FIGS. 3A–3C illustrate the effect of the distributed switching provided by output buffer 50 in comparison to the operation of prior art output buffer 10. FIG. 3A is a waveform showing output voltage (of both buffer 10 and 50) as a function of time. FIG. 3B shows the current spikes which are produced at each transistion of the output voltage (low-to-high and high-to-low). These current spikes are caused by the sudden surges of current which are present when output driver FETs 30 and 32 of output buffer 10 change state. It is these current spikes which result in ground bounce and ringing, and thus limit the ability of output buffer 10 to switch high drive currents.

FIG. 3C shows the results of the distributed switching provided by output buffer 50. By splitting the current carrying capacity between two FETs connected in parallel in each of the pull-up and pull-down circuits 68 and 70, the switching current pulses are spread out in time. Each output voltage transistion results in two smaller current spikes which, when summed together, produce the rounded curve shown in FIG. 3C. By reducing the magnitude of the current spikes, the present invention minimizes output signal distortion caused by ground bounce and ringing.

Output buffer 50 provides several other significant advantages over the prior art output buffer 10 shown in FIG. 1. The N-channel FET 84 of pull-up circuit 68 provides more current drive per unit area than a P-channel FET due to the higher electron mobility. This reduces the area of the pull-up circuit 68 itself and of previous stages, since the load on previous stages is reduced. The smaller P-channel pull-up FET 86 can provide full $V_{DD}$ pull-up under low load conditions, but limits the high output voltage $V_{OH}$ to about $V_{DD}$ minus 0.7 V for a 500 ohm load. This reduced $V_{OH}$ speeds up the high-to-low output transition due to the reduced voltage swing. N-channel FET 84 also provides a separation between the N-channel pull-down and P-channel pull-up, thus providing improved latch-up protection.

By using a pair of pull-down N-channel FETs 94 and 96 (rather than a single N-channel FET 32 as in FIG. 1), the previous stages of output buffer 50 and preceding logic can be made smaller due to a reduced load. This reduces the total number of stages in the complete data path, thus speeding up the device and reducing cost due to the smaller die area which is needed.

In the preferred embodiment of the present invention, output driver 50 is a CMOS integrated circuit with polysilicon gates. In this embodiment, delay resistance 98 is preferably formed by the polysilicon gates of FETs 94 and 96 (which are actually one large distributed device) and therefore is self-compensating for polysilicon dimensional variations. As the polysilicon gate narrows as a result of normal process variation, current drive will increase tending to cause more bounce. The narrowed polysilicon gate, however, causes resistance 98 to increase, thus creating more delay which tends to reduce bounce. Conversely, as the polysilicon gate widens, switching current is reduced. This is compensated, however, by a decrease in resistance 98, which causes less turn-on delay of FET 96 and hence more switching current.

In conclusion, the present invention is an improved CMOS output buffer which achieves high drive currents without sacrificing speed, and without creating output signal distortion due to internal chip ground bounce or output signal ringing. Although the present invention has been described with reference to preferred embodiments, workers skilled in that art will recognize the changes in form and detail may be made without departing from the spirit and scope of the invention.

What is claimed is:

1. An output buffer for producing an output at an output terminal comprising:
    a pull-up circuit responsive to a first signal for pulling the output toward a first supply potential when turned on, the pull-up circuit including first and second FETs, each having a gate, a source and a drain, the first and second FETs each having a current path formed by their source and drain connected in parallel between the output terminal and a first supply potential terminal, and first delay means connected to the gate of the second FET for delaying turn-on of the second FET with respect to turn-on of the first FET; and
    a pull-down circuit responsive to a second signal for pulling the output at the output terminal toward a second supply potential when turned on, the pull-down circuit including third and fourth FETs each having a gate, a source and a drain, the third and fourth FETs each having a current path formed by their source and drain connected in parallel between the output terminal and a second supply potential terminal, and a second delay means connected to the gate of the fourth FET for delaying turn-on of the fourth FET with respect to turn-on of the third FET.

2. The output buffer of claim 1 wherein the first FET is an N-channel FET and the second FET is a P-channel FET.

3. The output buffer of claim 2 wherein the first delay means is an inverter connected between gates of the first and second FETs.

4. The output buffer of claim 1 wherein the third and fourth FETs are N-channel FETs.

5. The output buffer of claim 4 wherein the second delay means comprises resistance means connected between gates of the third and fourth FETs.

6. The output buffer of claim 4 wherein the resistance means exhibits process-related dimensional variations which compensate for process-related dimensional variations of the gates of the third and fourth FETs.

7. The output buffer of claim 5 wherein the third and fourth FETs have polysilicon gates and wherein resistance means is formed by the polysilicon gates.

8. The output buffer of claim 1 and further comprising:
    turn-off means connected to the gate of the fourth FET for accelerating turn-off of the fourth FET.

9. The output buffer of claim 8 wherein the turn-off means comprises a fifth FET having a gate, a drain and a source, and wherein a current path formed by the drain and source of the fifth FET is connected to the gate of the fourth FET and having the gate connected to receive a third signal which is related to the second signal.

10. The output buffer of claim 9 wherein the fifth FET is an N-channel FET.

11. The output buffer of claim 1 and further comprising means connected to the gates of the first and third FETs for producing the first and second signals as a function of a DATA signal and an ENABLE signal.

12. The output buffer of claim 11 wherein the means for producing the first and second signals comprises:
a data terminal for receiving a DATA signal;
an enable terminal for receiving an ENABLE signal;
a first NAND gate having inputs connected to the data and enable terminal;
a first inverter connected to an output of the first NAND gate for producing the first signal;
a second inverter connected to the data terminal for providing an inverted DATA signal;
a second NAND gate having inputs connected to the enable terminal to receive the ENABLE signal and to the second inverter for receiving an inverted DATA signal; and
a third inverter connected to an output of the second NAND gate for producing the second signal.

13. An output buffer comprising:
a pull-up circuit connected between an output terminal and a first supply terminal, the pull-up circuit including a first N-channel FET having a gate, a source and a drain, a first P-channel FET having a gate, a source and a drain, and first delay means connected between the gates of the first N-channel FET and P-channel FET so that the first N-channel FET turns on before the P-channel FET, the N-channel FET and the P-channel FET having current paths formed by their sources and drains connected in parallel between the output terminal and the first supply terminal;
a pull-down circuit connected between the output terminal and a second supply terminal, the pull-down circuit including second and third N-channel FETs each having a gate, a source and a drain and having current paths formed by their sources and drains connected between the output terminal and the second supply terminal, and second delay means connected between the gates of the second and third N-channel FETs so that the second N-channel FET turns on before the third N-channel FET; and
means for supplying a first signal to the gate of the first N-channel FET; and
means for supplying a second signal to the gate of the second N-channel FET, wherein the output signal is a function of states of the first and second signals.

14. The output buffer of claim 13 wherein the first delay means comprises an inverter.

15. The output buffer of claim 13 wherein the second delay means comprises resistance means between gates of the second and third N-channel FETs.

16. The output buffer of claim 13 wherein the second and third N-channel FETs have polysilicon gates, and wherein the resistance means is formed by the polysilicon gates.

17. The output buffer of claim 13 and further comprising:
turn-off means connected to a gate of the third N-channel FET for accelerating turn-off of the third N-channel FET.

18. The output buffer of claim 17 wherein the turn-off means is a FET having a drain and a source forming a drain-source current path connected to the gate of the third N-channel FET.

19. The output buffer of claim 13 wherein the means for supplying a first signal derives the first signal from a DATA signal and an ENABLE signal; and the means for supplying a second signal derives the second signal from the DATA signal and the ENABLE signal.

20. An output buffer for producing an output at an output terminal comprising:
a pull-up circuit connected to the output terminal and responsive to a first signal for pulling the output toward a first supply potential when turned on, the pull-up circuit including first and second FETs, each having a gate, a source and a drain, the first and second FETs each having a current path formed by their source and drain connected in parallel between an output terminal and a first supply potential terminal, and delay means connected to the gate of the second FET for delaying turn-on of the second FET with respect to turn-on of the first FET; and
a pull-down circuit connected to the output terminal and responsive to a second signal for pulling the output at the output terminal toward a second supply potential when turned on.

21. The output buffer of claim 20 wherein the first FET is an N-channel FET and the second FET is a P-channel FET.

22. The output buffer of claim 21 wherein the first delay means is an inverter connected between gates of the first and second FETs.

23. An output buffer for producing an output at an output terminal comprising:
a pull-up circuit connected to the output terminal and responsive to a first signal for pulling the output toward a first supply potential when turned on; and
a pull-down circuit connected to the output terminal responsive to a second signal for pulling the output at the output terminal toward a second supply potential when turned on, the pull-down circuit including first and second FETs, each having a gate, a source and a drain, the first and second FETs each having a current path formed by their source and drain connected in parallel between the output terminal and a second supply potential terminal, and delay means connected to the gate of the second FET for delaying turn-on of the second FET with respect to turn-on of the first FET.

24. The output buffer of claim 23 wherein the first and second FETs are N-channel FETs.

25. The output buffer of claim 24 wherein the delay means comprises resistance means connected between gates of the first and second FETs.

26. The output buffer of claim 25 wherein the resistance means exhibits process-related dimensional variations which compenate for process-related dimensional variations of the gates of the first and second FETs.

27. The output buffer of claim 26 wherein the first and second FETs have polysilicon gates and wherein the resistance means is formed by the polysilicon gates.

28. The output buffer of claim 23 and further comprising:
turn-off means connected to the gate of the second FET for accelerating turn-off of the second FET.

29. The output buffer of claim 28 wherein the turn-off means comprises a third FET having a drain and a source forming a drain-source current path connected to a gate of the second FET and having a gate connected to receive a third signal which is related to the second signal.

30. The output buffer of claim 29 wherein the third FET is an N-channel FET.

31. The output buffer of claim 23 and further comprising means connected to the pull-up circuit and the pull-down circuit for producing the first and second signals as a function of a DATA signal and an ENABLE signal.

32. The output buffer of claim 31 wherein the means for producing the first and second signals comprises:

a data terminal for receiving a DATA signal;

an enable terminal for receiving an ENABLE signal;

a first NAND gate having inputs connected to the data and enable terminal;

a first inverter connected to an output of the first NAND gate for producing the first signal;

a second inverter connected to the data terminal for providing an inverted DATA signal;

a second NAND gate having inputs connected to the enable terminal to receive the ENABLE signal and to the second inverter for receiving an inverted DATA signal; and a third inverter connected to an output of the second NAND gate for producing the second signal.

* * * * *

REEXAMINATION CERTIFICATE (1936th)
United States Patent [19]
Boler et al.

[11] B1 4,638,187
[45] Certificate Issued Mar. 2, 1993

[54] CMOS OUTPUT BUFFER PROVIDING HIGH DRIVE CURRENT WITH MINIMUM OUTPUT SIGNAL DISTORTION

[75] Inventors: Clifford H. Boler, Bloomington; William W. Leake, St. Paul; Surinder S. Rai, Plymouth; Gene B. Zemske, Minneapolis, all of Minn.

[73] Assignee: Cypress Semiconductor (Minnesota) Inc.

Reexamination Request:
No. 90/002,667, Mar. 12, 1992

Reexamination Certificate for:
Patent No.: 4,638,187
Issued: Jan. 20, 1987
Appl. No.: 782,639
Filed: Oct. 1, 1985

[51] Int. Cl.⁵ .......................... H03K 21/10
[52] U.S. Cl. .................. 307/451; 307/443; 307/473; 307/270; 307/579; 307/585

[56]  References Cited

U.S. PATENT DOCUMENTS

| | | | |
|---|---|---|---|
| 3,591,855 | 7/1971 | Dean | 307/237 |
| 4,329,600 | 5/1982 | Stewart | 307/540 |
| 4,477,741 | 10/1984 | Moser, Jr. | 307/473 |
| 4,567,378 | 1/1986 | Raver | 307/270 |
| 4,621,208 | 11/1986 | Van Tran | 307/473 |
| 4,622,482 | 11/1986 | Ganger | 307/585 |
| 4,661,928 | 4/1987 | Yasuoka | 365/189 |

FOREIGN PATENT DOCUMENTS 58-43622 3/1983 Japan .
58-196726 11/1983 Japan .

OTHER PUBLICATIONS

The Art of Electronics, Horowitz et al. Cambridge Univ. Press, 1983, pp. 2 and 3.
Lin, et al., "Effect of Silicon–Gate Resistance on the Frequency Response of MOS Transistors", IEEE Transactions on Electronic Devices, vol. ED-22, No. 5, May 1975.
Sakurai, "Approximation of Wiring Delay in MOSFET LSI", IEEE Journal of Solid-State Circuits, vol. SC-18, No. 4, Aug. 1983.
Sakurai, et al., "Gate Electrode RC Delay Effects in VLSI's", IEEE Journal of Solid-State Circuits, vol. SC-20, No. 1, Feb. 1985.

*Primary Examiner*—William L. Sikes

[57]  ABSTRACT

A CMOS output buffer provides high drive current without sacrificing speed and with minimum output signal distortion due to internal chip ground bounce or output signal ringing. The output buffer includes a pull-up circuit and a pull-down circuit which distribute switching circuit spikes over time. The pull-up circuit includes a P-channel FET and an N-channel FET connected in parallel between an output terminal and supply terminal $V_{DD}$, with an inverter connected between the gates of the N-channel and P-channel FET to provide the proper phase for the P-channel FET as well as delaying turn-on of the P-channel FET with respect to turn-on of the N-channel FET. The pull-down circuit includes a pair of N-channel FETs connected in parallel between the output terminal and ground, and a delay resistance connected between their gates so that turn-on of one of the N-channel FETs is delayed with respect to the other.

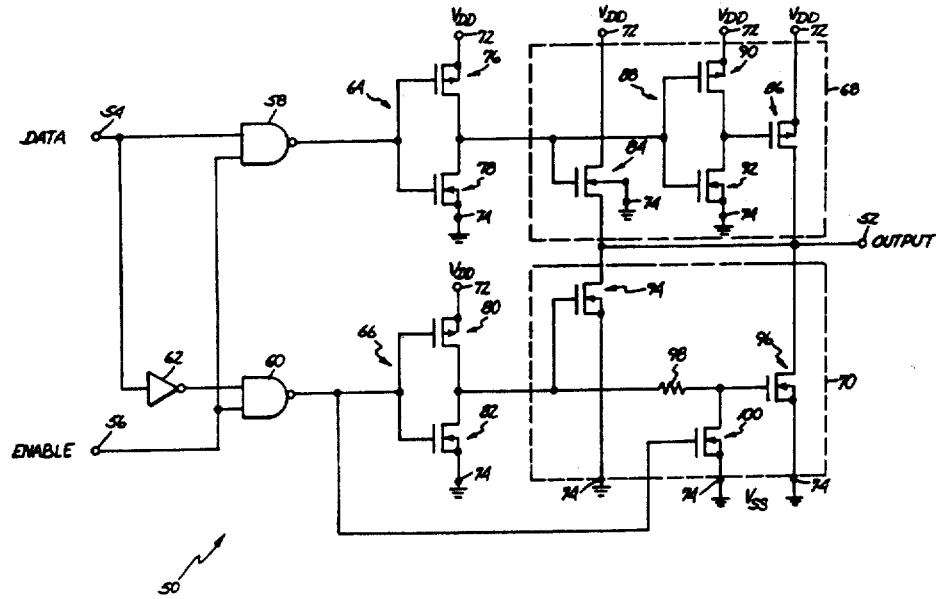

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1-19 and 21-32 is confirmed.

Claim 20 is cancelled.

* * * * *